US007696511B2

(12) United States Patent
Ohba et al.

(10) Patent No.: US 7,696,511 B2
(45) Date of Patent: Apr. 13, 2010

(54) MEMORY ELEMENT AND MEMORY DEVICE

(75) Inventors: Kazuhiro Ohba, Miyagi (JP); Tetsuya Mizuguchi, Kanagawa (JP); Takeyuki Sone, Miyagi (JP); Keitaro Endo, Miyagi (JP)

(73) Assignee: Sony Corporation, Tokyo (JP)

( * ) Notice: Subject to any disclaimer, the term of this patent is extended or adjusted under 35 U.S.C. 154(b) by 56 days.

(21) Appl. No.: 12/186,189

(22) Filed: Aug. 5, 2008

(65) Prior Publication Data

US 2009/0039337 A1    Feb. 12, 2009

(30) Foreign Application Priority Data

Aug. 6, 2007    (JP) ............... 2007-204032

(51) Int. Cl.
*H01L 47/00*    (2006.01)
(52) U.S. Cl. ............. 257/4; 257/3; 257/5; 257/E47.001
(58) Field of Classification Search .............. 257/4, 257/3, 5, E47.001
See application file for complete search history.

(56) References Cited

U.S. PATENT DOCUMENTS

| 2006/0126423 A1* | 6/2006 | Aratani et al. ............... 365/232 |
| 2007/0012959 A1* | 1/2007 | Hachino et al. ............. 257/260 |
| 2008/0164568 A1* | 7/2008 | Lee et al. ..................... 257/537 |

FOREIGN PATENT DOCUMENTS

| JP | 2002-536840 | 10/2002 |
| JP | 2007-189087 | 7/2007 |
| WO | WO 2006009090 A1 * | 1/2006 |

OTHER PUBLICATIONS

Nikkei Electronics, Feb. 20, 2003, p. 104.
Japanese Office Action issued on Nov. 4, 2009, for corresponding Application No. JP 2007-204032.

* cited by examiner

*Primary Examiner*—N Drew Richards
*Assistant Examiner*—Yu-Hsi Sun
(74) *Attorney, Agent, or Firm*—K&L Gates LLP

(57) ABSTRACT

A memory element having a storage layer containing an ion source layer between a first electrode and a second electrode is provided. The memory element stores information by changing an electrical characteristic of the storage layer, wherein at least Zr is added to the ion source layer as a metal element together with an ion conducting material.

18 Claims, 18 Drawing Sheets

F I G . 4
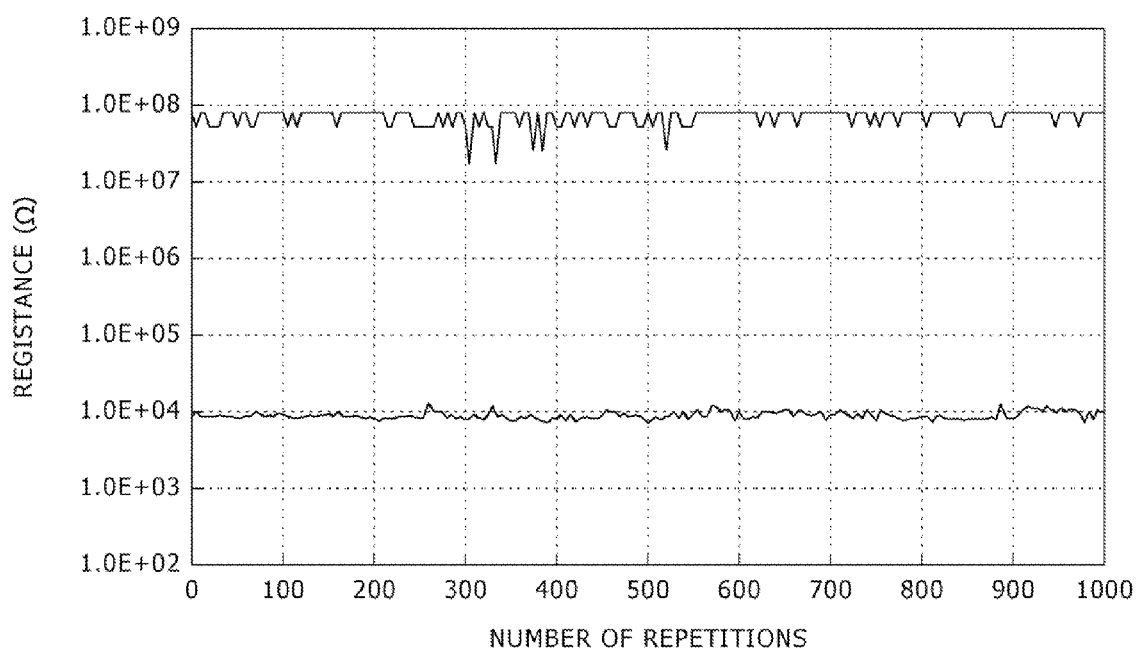

MEMORY ELEMENT AND MEMORY DEVICE

CROSS REFERENCES TO RELATED APPLICATIONS

The present application claims priority to Japanese Patent Application JP 2007-204032 filed with the Japan Patent Office on Aug. 6, 2007, the entire contents of which is being incorporated herein by reference.

BACKGROUND

High-speed and high-density DRAM (Dynamic Random Access Memory) has found wide application as RAM (Random Access Memory) in information equipment such as computer. However, DRAM involves high manufacturing cost for its complicated manufacturing process as compared to typical logic circuit LSI (Large Scale Integration) and signal processing used for electronic equipment. Further, DRAM is a volatile memory in which information is lost when power is removed. Therefore, it requires frequent refresh, which means that the written information (data) must be read, amplified again and rewritten.

For this reason, flash memory, FeRAM (Ferroelectric Random Access Memory) and MRAM (Magnetoresistive Random Access Memory) have been proposed, for example, as non-volatile memories which can retain information even when power is removed. These types of memories can retain the written data for extended periods even without any supply of power.

However, the aforementioned types of memories have their advantages and disadvantages. Flash memory is high in integration degree but disadvantageous in terms of operating speed. FeRAM has its limit in patterning required for high integration. This memory also has problems with its manufacturing process. MRAM has a power consumption problem.

Therefore, a new type of memory element is proposed which is particularly advantageous in overcoming the patterning limit of the memory element. This memory element has an ion conductor containing given metals sandwiched between two electrodes. In this memory element, one of the two electrodes contains the same metals as contained in the ion conductor. As a result, when a voltage is applied between the two electrodes, the metals diffuse into the ion conductor as ions. This changes the electrical characteristic, such as resistance value or capacitance, of the ion conductor. For example, JP-T-2002-536840 and Issue of Nikkei Electronics No. 20 (page 104), January, 2003, describe memory devices using this property. JP-T-2002-536840 in particular proposes an ion conductor which includes a solid solution made of chalcogenide and metal. More specifically, the ion conductor includes a material in which Ag, Cu and Zn are dissolved in AsS, GeS or GeSe. One of the two electrodes contains Ag, Cu and Zn.

However, if the ion conductor of the memory element configured as described above is left standing for extended periods in a low-resistance value stored state (e.g., "1") or in a high-resistance value erased state (e.g., "0"), or alternatively if the ion conductor is left standing at an atmospheric temperature higher than room temperature, the resistance value thereof will change, causing the memory element to lose the stored information. Thus, a memory element is unfit for use as a non-volatile memory if it has only low data retention capability.

Further, if, in recording a large amount of information per same area, it is possible to provide an intermediate arbitrary resistance value between, for example, a high resistance state of several hundreds of M$\Omega$ and a low resistance state of several k$\Omega$, rather than simply high resistance state of "0" and low resistance state of "1", then the memory will have a wider operating margin and can record multivalued information. That is, if one memory element can store four resistance states, two bits of information can be stored in each element. If one memory element can store 8 resistance values, three bits of information can be stored in each element. As a result, the memory capacity can be improved two-, three- or more fold.

With known memory elements, however, if the range of variable resistance value is, for example, from several k$\Omega$ to several hundreds of M$\Omega$, the resistance values which can be held in low and high resistance states are about 10 k$\Omega$ or less and 1 M$\Omega$ or more, respectively. Therefore, it is difficult to retain an intermediate resistance value between high and low resistance states, thus making it difficult to store multivalued information.

SUMMARY

The present disclosure relates to a memory element and a memory device capable of storing binary or more information by changing an electrical characteristic of a storage layer containing an ion source layer.

The present disclosure has been devised in light of the foregoing problem, and it is desirable to provide a memory element and a memory device which offer improved capability to retain resistance values in stored and erased states, allow for storage of multivalued information and have characteristics suitable for mass storage.

The memory element according to one embodiment includes a storage layer containing an ion source layer between first and second electrodes. The memory element stores information by changing an electrical characteristic of the storage layer. The ion source layer contains at least Zr (zirconium) as a metal element together with an ion conducting material. The amount of Zr contained in the ion source layer is preferably 3 atom % or more, and more preferably from 3 atom % or more to 40 atom % or less.

The memory device according to another embodiment includes a plurality of memory elements and a pulse application section. Each of the plurality of memory elements has a storage layer which contains an ion source layer between first and second electrodes, storing information by change of the electrical characteristic of the storage layer. The pulse application section selectively applies a voltage or current pulse to the plurality of memory elements. The memory device uses the memory elements according to one embodiment as its memory elements.

The memory element or memory device according to above embodiment assumes a low-resistance state when a voltage or current pulse is applied in a "positive direction" (e.g., negative potential to the first electrode and positive potential to the second electrode) to the element in an initial state (high-resistance state) as a result of the formation of a metal element conduction path containing Zr in the first electrode. When a voltage pulse is applied in a "negative direction" (e.g., positive potential to the first electrode and negative potential to the second electrode) to the element in a low-resistance state, the metal conduction path undergoes oxidation. This oxidation causes the metals to dissolve into the ion source layer, or alternatively the oxidation further causes additive elements such as Zr (and Si) in the ion source layer to form an oxide film in the anode electrode, changing the memory element to a high-resistance state.

Here, Zr making up the conduction path is relatively less likely to dissolve into the ion conducting material (e.g., chalcogenide) than Cu or other elements. This makes it more likely for the erased state or low-resistance state to be held once this state is assumed. On the other hand, if also dissolved as ions (positive ions) in the ion layer in the high-resistance erased state, Zr is not likely to be deposited in metal form on the cathode electrode. The reason for this is that Zr has a lower ion mobility than at least Cu and other elements. Therefore, Zr is unlikely to move even in the event of a temperature rise or even if left standing for extended periods. Alternatively, a Zr oxide is stable and unlikely to deteriorate in chalcogenide electrolyte. Therefore, the oxide maintains the high-resistance state even if exposed to a temperature higher than room temperature or left standing for extended periods.

The memory element and memory device according to embodiments contain zirconium (Zr) as a metal element together with an ion conducting material in an ion source layer. This provides improved resistance value retention capability in stored and erased states. Thanks to their improved resistance value retention characteristic, an intermediate state can be produced between high- and low-resistance states, for example, by adjusting the erasing voltage during a transition from low- to high-resistance states. This makes it possible to store multivalued information, thus allowing for mass storage.

Additional features and advantages are described herein, and will be apparent from the following Detailed Description and the figures.

BRIEF DESCRIPTION OF THE FIGURES

FIG. 4 is a diagram illustrating the repetitive operating characteristic of the memory element in example 1;

DETAILED DESCRIPTION

Figure 1:
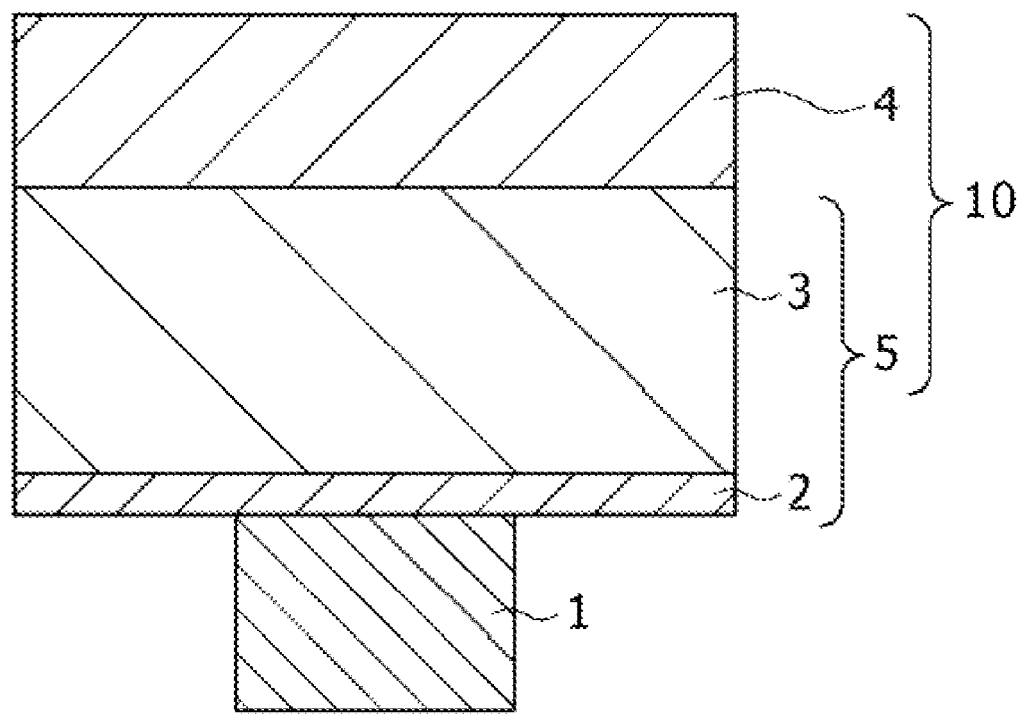
FIG. 1 is a sectional view illustrating the configuration of a memory element according to an embodiment.
Figure 2:
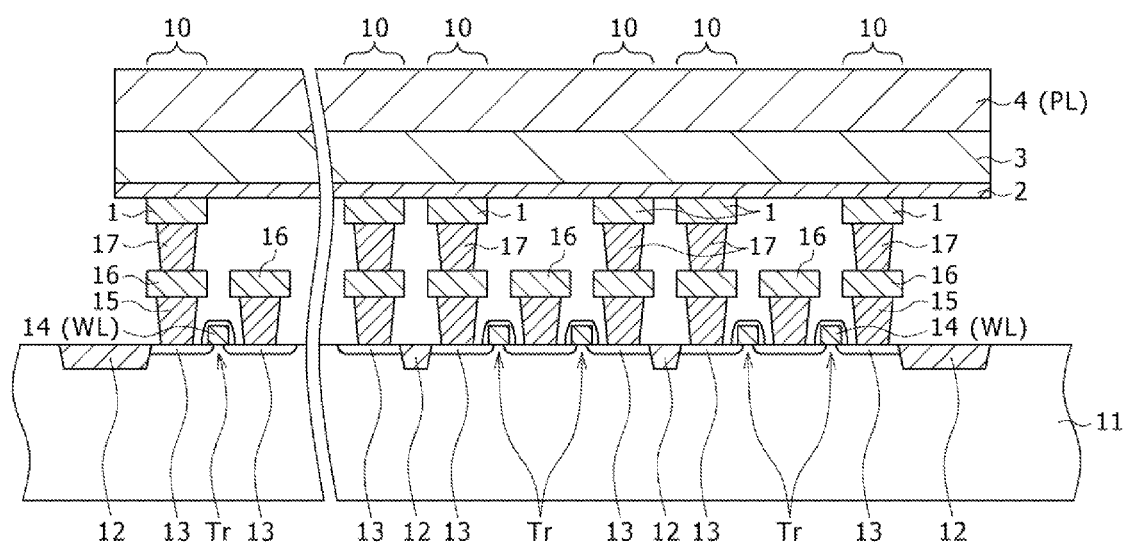
FIG. 2 is a sectional view illustrating the schematic configuration of a memory cell array using the memory element shown in FIG. 1.

FIG. 1 is a sectional configuration diagram of a memory element 10 according to an embodiment. The memory element 10 has a storage layer 5 between lower electrode 1 and upper electrode 4. Here, the lower electrode 1 is disposed, for example, above a silicon substrate 11 having CMOS (Complementary Metal Oxide Semiconductor) circuits formed thereon, as described later (FIG. 2). The lower electrode 1 serves as a connecting section with the CMOS circuit section.

Wiring materials used in semiconductor process can be used for the lower electrode 1. Among such materials are W (tungsten), WN (tungsten nitride), Cu (copper), Al (aluminum), Mo (molybdenum), Ta (tantalum) and silicide. If a material such as Cu is used which may cause ionic conduction under electric field, the electrode made of Cu or other material may be coated with W, WN, TiN (titanium nitride), TaN (Tantalum nitride) or other material which is resistant to ionic conduction or thermal diffusion.

The storage layer 5 includes a high-resistance layer 2 and ion source layer 3 stacked one on top of another from the side of the lower electrode 1. The ion source layer 3 contains Cu (copper) and Zr (zirconium) as (ionizable) metal elements together with an ion conducting material. Among possible ion conducting materials are S (sulfur), Se (selenium) and Te (tellurium) (chalcogenide elements). The ion conducting material may be made of one or a combination of two or more of these elements. More specifically, CuTeZr, CuSZr or CuSeZr can be used, for example, for the ion source layer 3. It should be noted that other elements such as Si (silicon) may also be contained. Here, in order to form the ion source layer 3, a TeZr layer not containing Cu may be formed on the high-resistance layer 2, followed by the formation of a Cu layer on the TeZr layer in such a manner as to achieve a desired proportion of zirconium. In this case, Cu quickly diffuses into TeZr or other chalcogenide. This provides a microstructure similar to that resulting from alloying Cu in a chalcogenide.

Any insulator or semiconductor may be used for the high-resistance layer 2 so long as it is stable even in contact with the ion source layer 3 which includes Cu-chalcogenide. A rare earth metal such as Gd (gadolinium), or oxide or nitride containing at least one of Al, Mg (magnesium), Ta, Si (silicon) and Cu is preferable. It should be noted that the high-resistance layer 2 is not essential in the present application. However, it is preferred to dispose the same layer 2 in order to stabilize the data retention characteristic. In this case, the same layer 2 is formed to be in contact with the lower electrode 1 as illustrated in FIG. 1.

A known semiconductor wiring material can be used for the upper electrode 4 as for the lower electrode 1.

In the memory element 10 of the present embodiment, the electrical characteristic of the storage layer 5 such as its resistance value changes when a voltage or current pulse is applied to the same element 10 from an unshown power source via the lower electrode 1 and upper electrode 4. This allows information to be stored, erased or read. This operation will be described more specifically below.

First, a positive voltage is applied to the memory element 10 so that the upper electrode 4 is at positive potential and the lower electrode 1 at negative potential. This permits ionic conduction of positive Cu and Zr ions from the ion source layer 3, causing the ions to combine with electrons in the lower electrode 1 and become deposited. As a result, low-resistance Cu and Zr conduction paths (filaments), reduced to a metal form, are formed at the interface between the lower electrode 1 and storage layer 5. Otherwise, conduction paths are formed in the high-resistance layer 2. This brings down the resistance value of the storage layer 5, changing the same layer 5 from the initial high-resistance state to the low-resistance state.

Thereafter, even if the positive voltage is removed to eliminate the voltage from the memory element 10, the same element will retain the low-resistance state, thus allowing information to be stored. When the memory element 10 is used for a so-called PROM (Programmable Read Only Memory) which can record information only once, the recording is complete by the above recording process. On the other hand, when the memory element 10 is used for an erasable memory device, namely, RAM (Random Access Memory), EEPROM (Electronically Erasable and Programmable Read Only Memory) or other device, an erasing process is required. In the erasing process, a negative voltage is applied to the memory element 10 so that, for example, the upper electrode 4 is at negative potential and the lower electrode 1 at positive potential. As a result, Cu and Zr in the conduction paths formed in the storage layer 5 become ionized as a result of oxidation. The Cu and Zr ions dissolve into the ion source layer 3 or combine, for example, with Te to form compounds such as $Cu_2Te$ and $CuTe$. This causes the Cu and Zr conduction paths to disappear or reduce, thus raising the resistance value. Otherwise, additive elements such as Zr and Si in the ion source layer 3 form an oxide film in the anode electrode, changing the memory element 10 to a high-resistance state.

Thereafter, even if the negative voltage is removed to eliminate the voltage from the memory element 10, the same element will remain in the high-resistance state. This makes it possible to erase the recorded information. By repeating the steps described above, it is possible to record (write) information into the memory element 10 and erase the recorded information therefrom repeatedly.

Then, if, for example, the high-resistance state is associated with information of "0" and the low-resistance state with information of "1", the information can be changed from "0" to "1" in the information recording process conducted by applying a positive voltage and from "1" to "0" in the information erasing process conducted by applying a negative voltage. The resistance value after the recording is dependent upon the recording conditions such as pulse width of the voltage or current pulse applied and amount of current during the recording rather than the cell size of the memory element 10 and the material composition of the high-resistance layer 2. The resistance value after the recording is from several k$\Omega$ to 100 M$\Omega$ when the initial resistance value is 100 M$\Omega$ or greater.

In order to read the recorded data, the larger the ratio between the initial and post-recording resistance values, the better. However, if the high-resistance layer has an excessively high resistance value, it is difficult to write information, namely, change the storage layer 5 to a low-resistance state, thus resulting in an excessively large writing threshold voltage. Therefore, the initial resistance value is adjusted to 1 G$\Omega$ or less. The resistance value of the high-resistance layer 2 can be controlled by the thickness of the same layer 2 or amount of oxygen contained therein if the same layer 2 is formed, for example, with an oxide of a rare earth element. It should be noted that if the high-resistance layer 2 is not formed, resistance value of the high-resistance layer 2 can be controlled by the erasing current and voltage.

As described above, in the memory element 10 of the present embodiment, the storage layer 5 includes the high-resistance layer 2 and ion source layer 3 which contains Cu and Zr as metal elements. Therefore, information can be recorded thereto, and recorded information can be erased therefrom by applying a voltage or current pulse to the upper electrode 4 and lower electrode 1.

Here, the present embodiment provides improved capability to retain the resistance value in any range as compared to the existing memory elements. The reason therefor will be described below.

That is, in the present embodiment, the ion source layer 3 contains Zr in addition to Cu. As a result, not only Cu but also Zr function as ionizing elements, forming conduction paths in which Cu and Zr coexist. Cu is relatively likely to dissolve into a chalcogenide. However, a Zr conduction path is relatively unlikely to dissolve thereinto. Therefore, once a written state or low-resistance state is assumed, a Zr conduction path is more likely to retain a low-resistance state than a Cu-only conduction path.

Also in the case of retaining a high-resistance erased state, if Zr is contained as when a Zr conduction path is formed and Zr is dissolved again in the ion source layer 3 as ions, Zr is less likely to move than Cu even in the event of a temperature rise or even if left standing for extended periods, thanks to its ion mobility lower than that of Cu. As a result, Zr is not likely to be deposited in metal form on the cathode electrode. Alternatively, a Zr oxide is stable and unlikely to deteriorate in chalcogenide electrolyte. Therefore, the oxide maintains the high-resistance state even if exposed to a temperature higher than room temperature or left standing for extended periods.

Thus, in the present embodiment, the ion source layer 3 includes Zr together with a chalcogenide element and Cu. As a result, any range of resistance values can be held as described above. Therefore, if an intermediate state is produced between high- and low-resistance states, for example, by adjusting the erasing voltage during a transition from low- to high-resistance states, this intermediate state can be stably held. This makes it possible to provide not only binary but also multivalued memories.

Incidentally, the resistance value retention characteristic varies depending on the amount of Zr added.

For example, if Zr is excessively large in amounts, the resistance value of the ion source layer 3 drops excessively. As a result, an effective voltage cannot be applied to the ion source layer 3. Otherwise, Zr cannot readily dissolve into the chalcogenide layer. Therefore, erasing is particularly difficult. The erasing voltage rises according to the amount of Zr added. Further, if the amount of Zr added is excessively large, writing or changing the storage layer 5 to a low-resistance state will become difficult. On the other hand, if the amount of Zr added is excessively small, the storage layer 5 is less effective in providing improved capability to retain any range of resistance values. Therefore, the amount of Zr contained in the ion source layer 3 is preferably 3 atom % or more, and more preferably from 3 atom % or more to 40 atom % or less. Still more preferably, the amount of Zr contained in the ion source layer 3 is from 3 atom % or more to 25 atom % or less, from the viewpoint of balance with proper memory operational characteristics. It is to be noted that the amount of Cu contained in the ion source layer 3 is 0 atom % or more to 50 atom % or less, and the optimum value varies depending on the amount of Zr.

It should be noted that, in the present embodiment, other elements may be added, for example, to inhibit the film from peeling off during high temperature thermal treatment. For example, silicon (Si), an additive element which holds promise for improved resistance value retention characteristic at the same time, is preferably added to the ion source layer 3 together with Zr. However, prevention of the film peeling cannot be expected if Si is added in excessively small amounts. On the other hand, addition of Si in excessively large amounts leads to improper memory operational characteristics. Therefore, the Si content in the ion source layer 3 should preferably be in the range about from 10 to 45 atom %. The memory element formed as described above offers significantly improved resistance value retention characteristic in any range of resistance values and can store multivalued information thanks to its significantly improved resistance value retention characteristic.

The manufacturing method of the memory elements 10 of the present embodiment will be described below.

First, the lower electrode 1 made, for example, of W is formed above a substrate which has CMOS (Complementary Metal Oxide Semiconductor) circuits such as select transistors formed thereon. Then, oxides are removed from the surface of the lower electrode 1 by reverse sputtering or other technique. Next, the high-resistance layer 2 made of a Gd oxide film is formed. To accomplish this, a metal Gd film of 1 nm in thickness, for example, is formed using a Gd target, after which the film undergoes oxidation by oxygen plasma. Next, the ion source layer 3 or CuTeSiZr film is formed by DC magnetron sputtering. Next, a W (tungsten) film is formed as the upper electrode 4. The layered films are formed as described above.

Then, of these layered films, the high-resistance layer 2, ion source layer 3 and upper electrode 4 are patterned by plasma etching or other technique. These layers may be patterned by an etching technique such as ion milling or RIE (Reactive Ion Etching) in addition to plasma etching. Next, a wiring layer is formed for connection with the upper electrode 4. Then, all the memory elements 10 are connected to a contact portion adapted to provide a common potential. Next, the layered films undergo thermal treatment. The memory elements 10 are manufactured as described above.

Thus, the memory element 10 of the present embodiment offers excellent data retention characteristic thanks to Zr and Si contained in the storage layer 5 in addition to Cu and a chalcogen element. Further, the memory element 10 can retain data even if the current driving capability of the transistor diminishes as a result of miniaturization. Therefore, high packing density and downsizing can be achieved by configuring a memory device using the memory elements 10. Further, the lower electrode 1, high-resistance layer 2, ion source layer 3 and upper electrode 4 can all include materials which can be sputtered, thus simplifying the manufacturing process. That is, these layers need only to be sputtered sequentially using targets having compositions suitable for the respective layers. Still further, these layers can also be formed continuously in the same sputtering system by changing targets.

A memory device (memory) can be configured, for example, by arranging a number of the memory elements 10 in an array or matrix form. At this time, an element selection MOS (Metal Oxide Semiconductor) transistor or diode is connected as occasion demands to configure a memory cell. Further, the memory cell is connected to the sensing amplifier, address recorder, recording/erasing/reading circuit and other circuitry.

Figure 3:
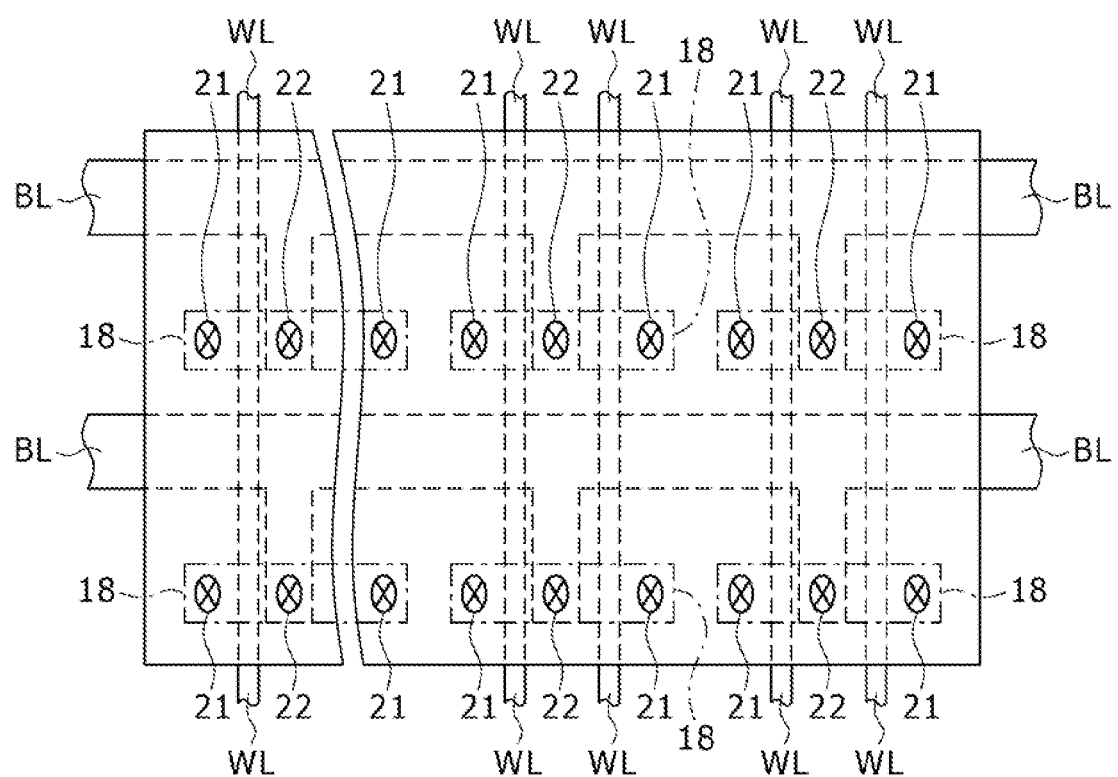
FIG. 3 is a plan view of the memory cell array.
Figure 5A:
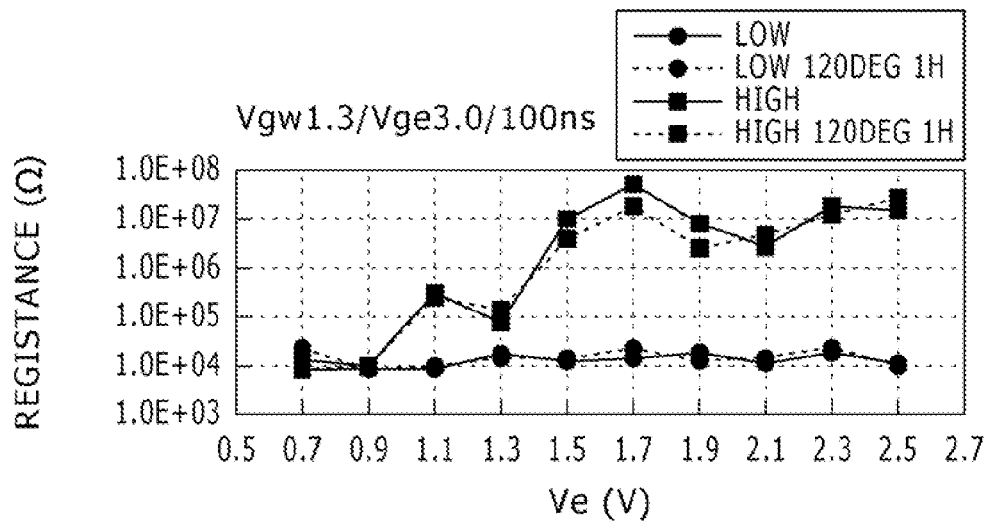
FIGS. 5A to 5C are characteristic diagrams illustrating the erasing voltage dependence of resistance values in written and erased states in example 1.
Figure 5B:
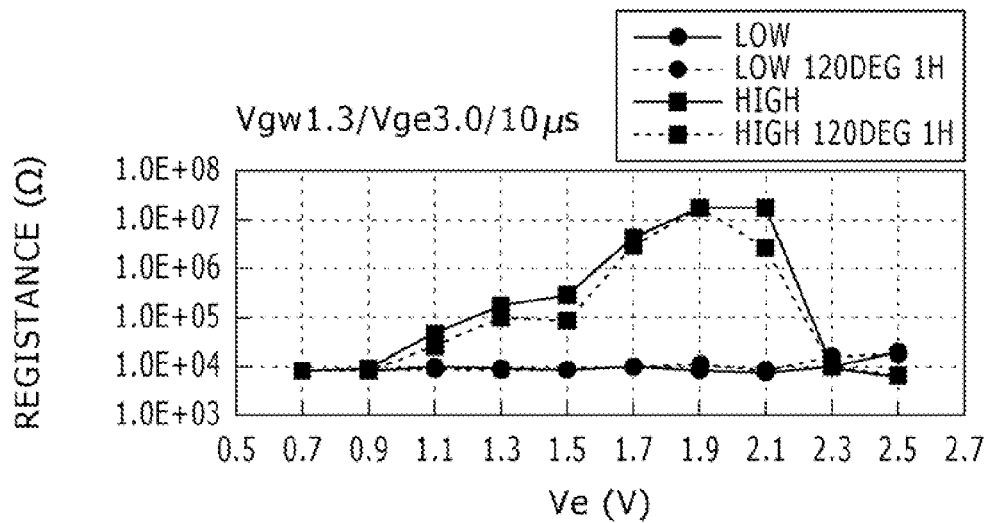
Figure 5C:
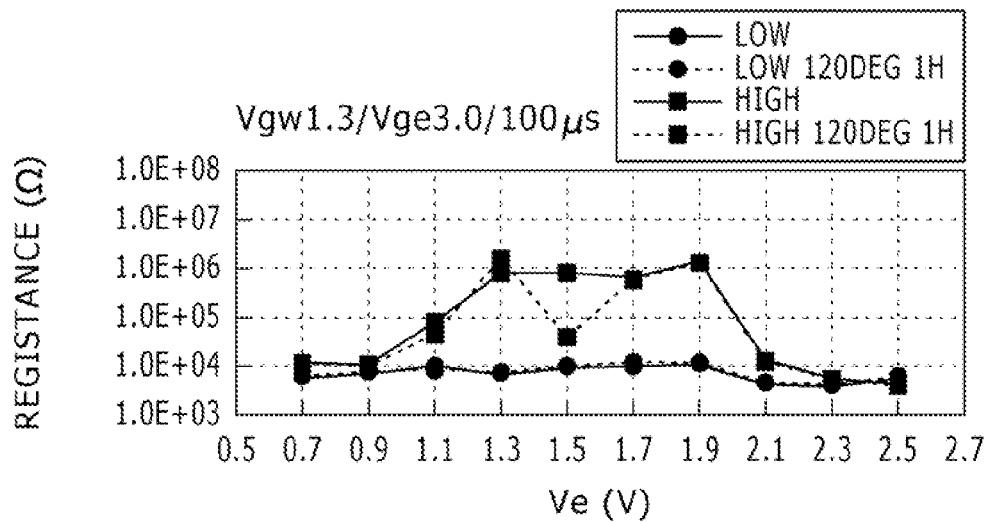
Figure 6A:
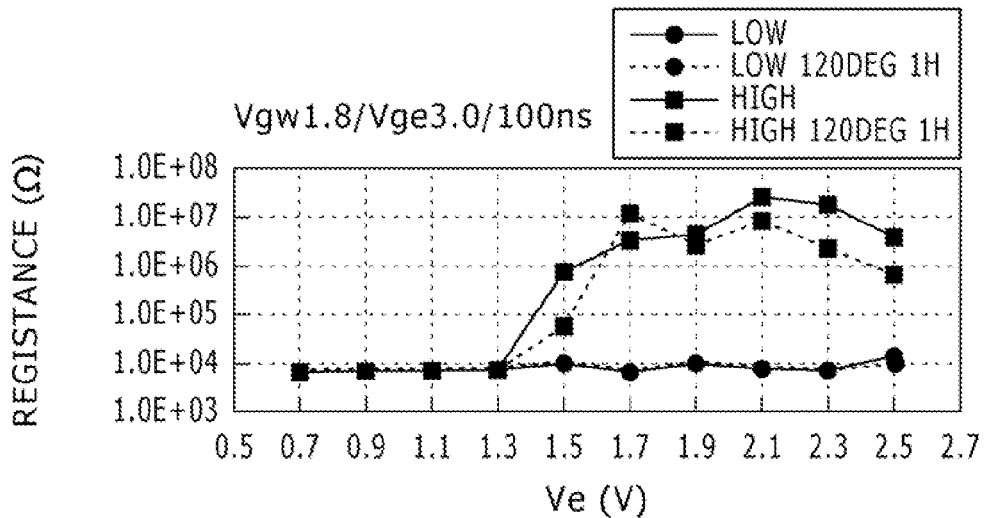
FIGS. 6A to 6C are also characteristic diagrams illustrating the erasing voltage dependence.
Figure 6B:
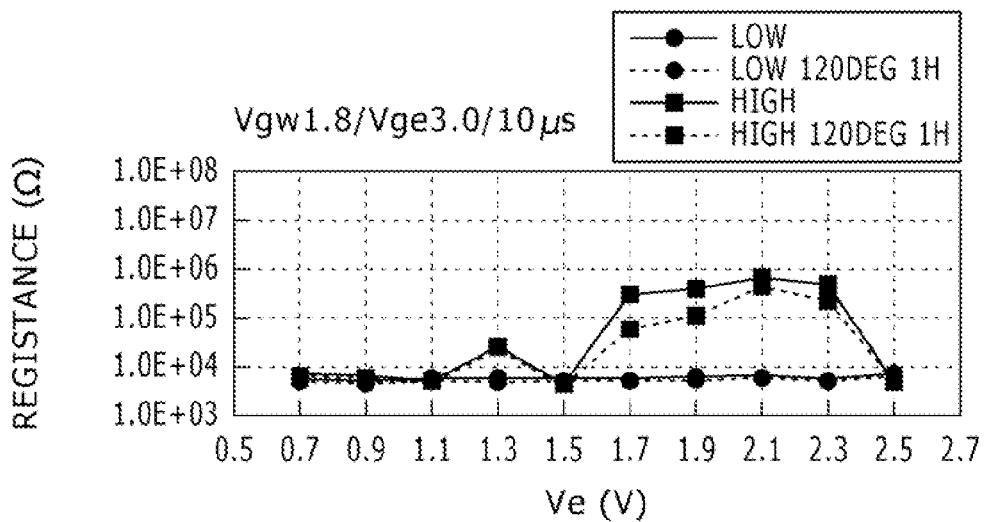
Figure 6C:
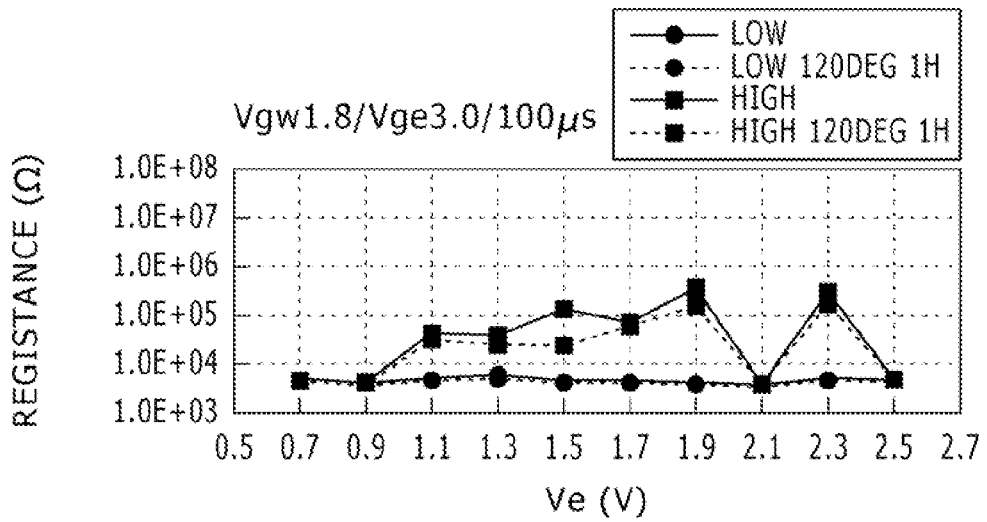

FIGS. 2 and 3 illustrate an example of a memory device (memory cell array) having a number of the memory elements 10 arranged in a matrix form. FIGS. 2 and 3 illustrate the sectional and plan configurations of the memory cell array, respectively. The memory cell array has a wiring connected to the lower electrode 1 of each of the memory elements 10. The memory cell array also has another wiring connected to the upper electrode 4 thereof. The two wirings are disposed to intersect each other. Each of the memory elements 10 is disposed, for example, close to the interconnection point between the two wirings. Further, the wiring connected to the upper electrode 4 is formed commonly across the array.

More specifically, the memory elements 10 share the high-resistance layer 2, ion source layer 3 and upper electrode 4. That is, the high-resistance layer 2, ion source layer 3 and upper electrode 4 each include a layer common to all the memory elements 10 (same layer). Of these, the commonly formed upper electrode 4 serves as a plate electrode PL. On the other hand, the lower electrode 1 is formed separately for each of the memory cells, thus electrically isolating the memory cells from each other. The lower electrode 1 provided for each of the memory cells determines the position of the memory element 10 associated with the same electrode 1. The lower electrodes 1 are each connected to an associated cell selection MOS transistor Tr. Each of the memory elements 10 is formed above the MOS transistor Tr. The MOS transistors Tr each include source/drain regions 13 and gate electrode 14. The source/drain regions 13 are formed in a region isolated by an element isolation layer 12 in the semiconductor substrate 11. A sidewall insulating layer is formed on the wall surface of the gate electrode 14. The gate electrode 14 serves also as a word line WL which is one of the two address wirings of the memory element 10. One of the two source/drain regions 13 of the MOS transistor Tr is electrically connected to the lower electrode 1 of the memory element 10 via a plug layer 15, metal wiring layer 16 and plug layer 17. The other source/drain region 13 of the MOS transistor Tr is connected to the metal wiring layer 16 via the plug layer 15. The metal wiring layer 16 is connected to a bit line BL (refer to FIG. 3) which is the other address wiring of the memory element. It should be noted that an active region 18 of the MOS transistor Tr is shown by a dashed line in FIG. 3 and that contact portions 21 and 22 thereof are connected respectively to the lower electrode 1 of the memory element 10 and the bit line BL.

In this memory cell array, when a voltage is applied to the bit line BL as the gate of the MOS transistor Tr is turned on by the word line WL, a voltage is applied to the lower electrode 1 of the selected memory cell via the source and drain of the MOS transistor Tr. Here, when the voltage applied to the lower electrode 1 is negative relative to the potential of the upper electrode 4 (plate electrode PL), the memory element 10 changes to a low-resistance state as described above. This causes information to be recorded in the selected memory cell. Next, when a positive voltage relative to the potential of the upper electrode 4 (plate electrode PL) is applied to the lower electrode 1, the memory element 10 changes back to a high-resistance state. This causes the recorded information to be erased from the selected memory cell. To read the recorded information, a memory cell is selected by the MOS transistor Tr, after which a given voltage or current is applied to the selected cell. Depending on the resistance state of the memory element 10 at this moment, a different current or voltage is detected via a sensing amplifier or other component connected to the bit line BL or the tip of the plate electrode PL. It should be noted that the voltage or current applied to the selected memory cell is smaller than the threshold voltage or current at which the memory element 10 changes its resistance state.

The memory device of the present embodiment is applicable to a variety of memory devices as mentioned earlier. For example, the memory device is applicable to any form of memory, including a so-called PROM (Programmable Read Only Memory) which can record information only once, electrically erasable EEPROM (Erasable and Programmable Read Only Memory) and so-called RAM which can record, erase and reproduce information at high speed.

EXAMPLES

Specific examples will be described below.

Example 1

First, the MOS transistors Tr were formed on the semiconductor substrate 11 as illustrated in FIGS. 2 and 3. Next, an insulating layer was formed to cover the surface of the semiconductor substrate 11, after which via holes were formed in the insulating layer. Next, the via holes were filled with an electrode material made of W (tungsten) by CVD (Chemical Vapor Deposition), followed by the planarization of the via hole surfaces by CMP (Chemical Mechanical Polishing). The above process was repeated to form the plug layer 15, metal wiring layer 16, plug layer 17 and lower electrode 1 and further pattern the lower electrode 1 for each of the memory cells. The opening portion of the lower electrode 1 was 300 nm in diameter. Next, the lower electrode 1 was etched by about 1 nm by reverse sputtering using a RF power source to remove oxides from the surface of the same electrode 1. At this time, the surface of the lower electrode 1 was planarized substantially to the same height as the surrounding insulating layer. Next, a metal Gd film of 1 nm in thickness was formed by DC magnetron sputtering. Further, the Gd film was subjected to oxidation for 10 seconds by RF plasma under conditions of a chamber pressure of 1 m Torr, $O_2$ atmosphere and 500 W power. The Gd oxide was used as the high-resistance layer 2.

Next, a CuTeZrSi film was deposited to a thickness of 30 nm as the ion source layer 3 on the top of the high-resistance layer 2. The CuTeZrSi film was composed of 22% Cu, 21% Te, 22% Zr and 36% Si (atom %). Further, a W film of 20 nm in thickness was formed as the upper electrode 4 on the top of the ion source layer 3. Then, the high-resistance layer 2, ion source layer 3 and upper electrode 4, formed over the entire surface of the semiconductor substrate 11, were patterned in such a manner as to leave these layers unremoved in the entire memory section, thus forming the memory element 10 illustrated in FIG. 1. At the same time, the upper electrode 4 was etched on its surface so as to expose the contact portions. The contact portions were connected to external circuitry to give an intermediate potential (Vdd/2). Further, a wiring layer (Al layer) of 200 nm in thickness was formed to be connected to the exposed contact portions. Next, a thermal treatment was conducted in a vacuum thermal treatment furnace at 300° C. for two hours. The memory cell array illustrated in FIGS. 2 and 3 was fabricated as described above for use as example 1.

Examples 2 to 5

A CuTeZrSi film was deposited to a thickness of 30 nm as the ion source layer 3. In example 2, the film was composed of 34% Cu, 23% Te, 3% Zr and 39% Si (atom %). In example 3, the film was composed of 40% Cu, 24% Te, 8% Zr and 27% Si (atom %). In example 4, the film was composed of 17% Cu, 24% Te, 17% Zr and 24% Si (atom %). In example 5, the film was composed of 34% Cu, 33% Te and 33% Zr (atom %). The memory cell arrays were fabricated in the same manner as in example 1 except for the above film compositions.

Example 6

As example 6, the lower electrodes 1, formed above the semiconductor substrate 11 having CMOS circuits formed thereon, were covered with a $SiO_2$ oxide film of about 15 nm in thickness as with example 1 for use as an interlayer insulating film, as illustrated in FIGS. 2 and 3. The MOS transistors Tr were included in the CMOS circuits. Then, contact holes of 20 nm in diameter were patterned by electron lithography. Thereafter, the high-resistance layer made of a Gd oxide film was formed as with example 1, and the storage layer composed of 22% Cu, 21% Te, 22% Zr and 36% Si (atom %) was formed, thus fabricating a memory cell array made up of the memory elements as with example 1. It should be noted that the element of the sample for example 6 was 20 nm in size.

Example 7

As example 7, contact holes of 20 nm in diameter were formed via a $SiO_2$ interlayer insulating film above the lower electrodes 1. The same electrodes 1 were formed above a semiconductor substrate having CMOS circuits formed thereon. The MOS transistors Tr were included in the CMOS circuits. The ion source layer 3, composed of 43% Cu, 25% Te, 5% Zr and 28% Si (atom %), was formed directly in the contact holes without forming the high-resistance layer 2. Further, a W film of 20 nm in thickness was formed as the upper electrode 4 on the top of the ion source layer 3 so that the two layers could serve as the storage layer 5. Thus, a memory cell array was fabricated in the same manner as with example 1.

Comparative Examples 1 and 2

In comparative example 1, a CuTeSi film was deposited to a thickness of 30 nm as the ion source layer 3. The CuTeSi film was composed of 42% Cu, 22% Te and 37% Si (atom %). In comparative example 2, a CuTeZrSi film was deposited to a thickness of 30 nm as the ion source layer 3. The CuTeZrSi film was composed of 39% Cu, 22% Te, 1.5% Zr and 37% Si (atom %). The memory cell arrays were fabricated in the same manner as in example 1 except for the above film compositions.

(Characteristic Evaluation)

For the memory cell array of example 1, the "writing operation" was performed to a total of 20 elements (10 elements×2 columns) in the same array. The writing operation was conducted as follows. That is, an upper wiring layer connected to the upper electrode 4 was grounded to the intermediate potential of Vdd/2. A voltage was applied to the gate electrode or word line WL of the memory cell to be selected, thus turning on the word line WL. A voltage of 3.0 V having a pulse width of 10 μs, for example, was applied to the electrode or bit line BL of one of the source/drain regions 13 of the transistor Tr which was not connected to the memory element 10. After the writing operation, the resistance value was read. Next, the "erasing operation" was performed to the same 20 elements in total (10 elements×2 columns) in the same array. The erasing operation was conducted as follows. That is, a voltage of 3.0 V was applied to the gate electrode to turn it on. Then, voltages from −0.7V to −2.5V in steps of 0.2V with, for example, 10 μs of pulse width were applied to the same 20 elements. After the erasing operation, the resistance value in an erased state was read. This cycle of writing and erasing operations was repeated 1000 times for the memory cell array to evaluate the repetitive operating characteristic. The high-speed operating characteristic can be evaluated, for example, by reducing the pulse width during the writing or erasing operation. Further, after the repetition of the writing and reading operations 1000 times, the 10 elements in one column were left in a written state, whereas the 10 elements in another column were left in an erased state for measurement of the resistance values in the two states. Next, the memory cell array was placed in an oven at 120° C. for one hour for a high temperature accelerated retention test. Following the test, the resistance values in the two states were read. The data retention characteristic was evaluated by comparing the resistance values before and after the high temperature accelerated retention test. The repetitive operating characteristic of the memory element in example 1 thus obtained is illustrated in FIG. 4.

Next, with the pulse width set to 100 ns, 10 μs and 100 μs, a writing voltage Vw to 3.0V, writing gate voltage Vgw to 1.3 V and 1.8 V and erasing gate voltage to 3.0 V, an erasing voltage Ve was varied from 0.7 V to 2.5 V. This operation was repeated 1000 times. Then, the dependence of the resistance values in the written (low-resistance) and erased (high-resistance) states before and after the high temperature accelerated retention test, conducted at 120° C. for one hour, on the erasing voltage was examined. The results are shown in FIGS. 5A to 5C and 6A to 6C. The resistance value before the test is shown by a solid line, and that after the test by a dotted line.

From the above, it is clear that any resistance value in an erased state was held roughly at the set level despite the variation thereof depending on the writing and erasing voltages and pulse width.

Figure 7:
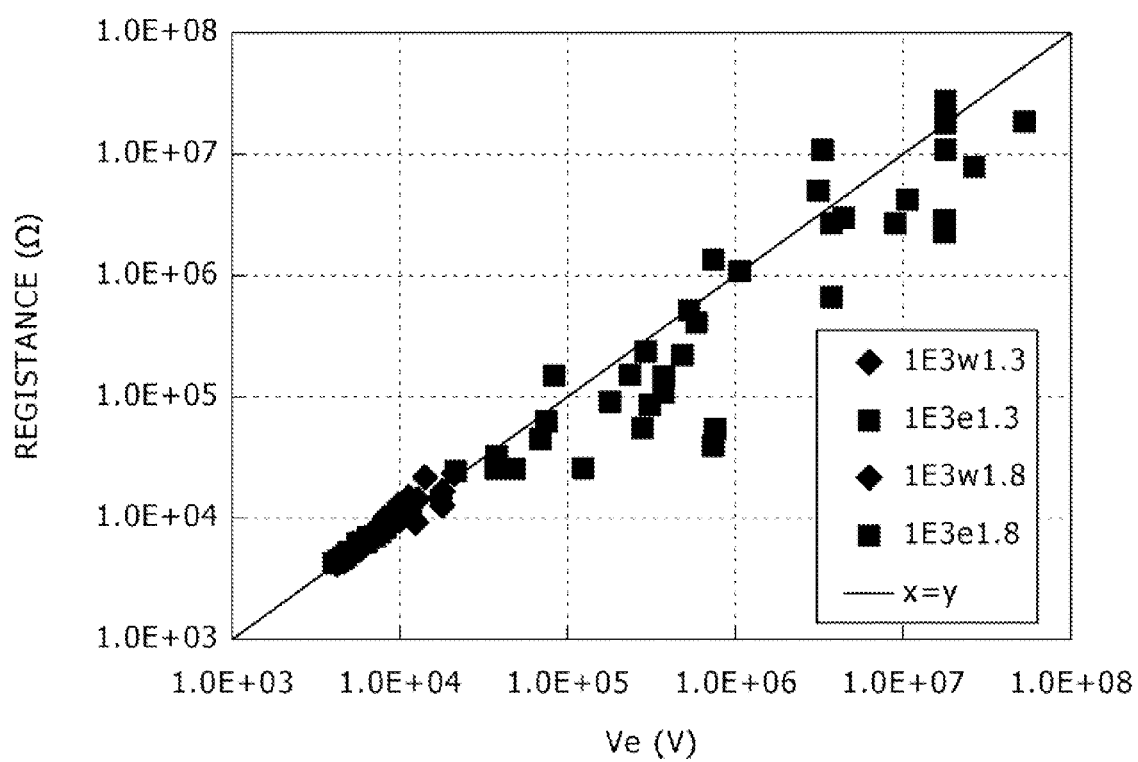
FIG. 7 is a scatter diagram plotting the change in resistance value before and after an accelerated retention test in example 1.

It should be noted that FIG. 7 is a scatter diagram plotting the various changes in resistance value after the accelerated retention test obtained from FIGS. 5A to 5C and FIGS. 6A to 6C illustrating the erasing voltage dependence. Here, the horizontal axis represents the resistance value before the test, and the vertical axis that after the test. If the resistance value remained unchanged between before and after the test, the value would be plotted on a diagonal line running from bottom left to top right in the figure. In the sample of example 1, the resistance value is plotted roughly on the diagonal line. This indicates that the memory cell array offers excellent data retention characteristic in any range of resistance values.

Figure 8:
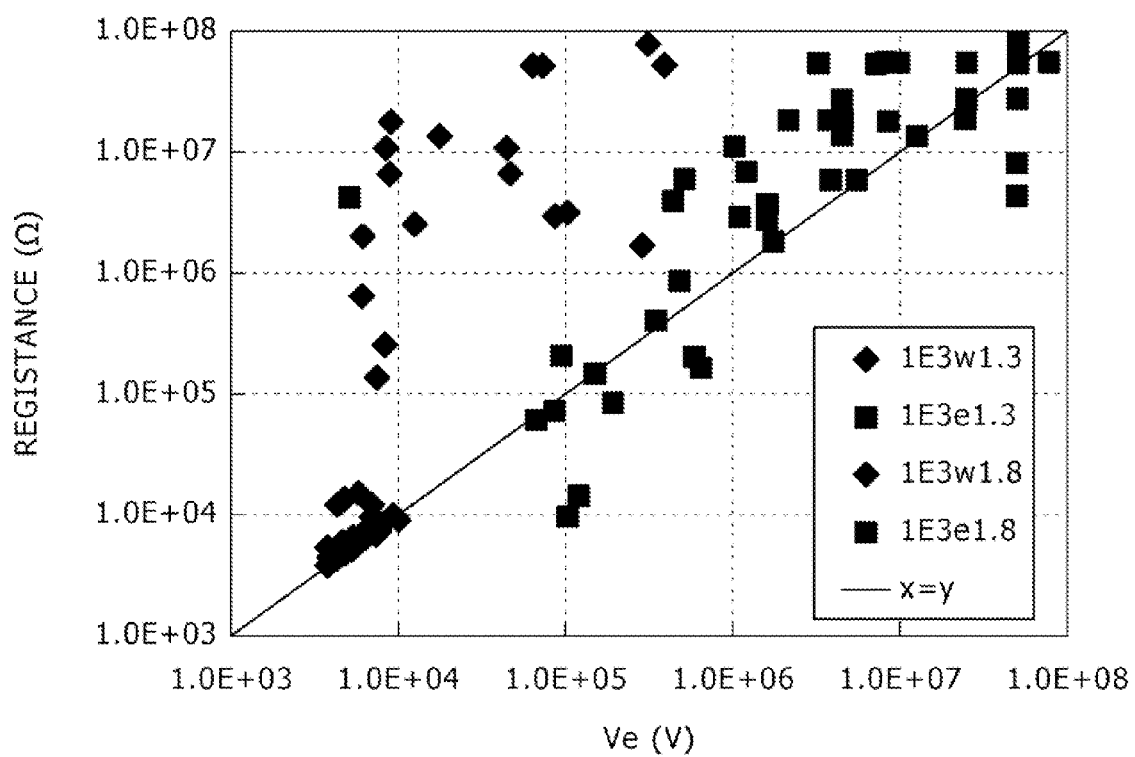
FIG. 8 is a scatter diagram plotting the change in resistance value before and after an accelerated retention test in comparative example 1.

The sample of comparative example 1 was also subjected to a repeated retention test in the same manner as for the sample of example 1. FIG. 8 illustrates a scatter diagram plotting the change in resistance value before and after the test.

The sample of comparative example 1 fails to offer proper data retention capability over the entire range of resistance values because the sample in a written state roughly beyond 10 kΩ increased in resistance value after the accelerated retention test as illustrated in FIG. 8. The above difference is probably derived from the fact that the ion source layer 3 in example 1 was composed of Cu, Te, Zr and Si whereas the same layer 3 in comparative example 1 did not contain Zr.

Next, the samples of examples 2 and 3 and comparative example 2 were compared to examine the extent to which the improvement in data retention characteristic would differ over the entire range of resistance values depending on the amount of Zr added. As shown in Table 1, the amounts of Zr added were 3 atom %, 8 atom % and 1.5 atom % for the respective samples.

TABLE 1

| Sample | Cu | Te | Zr | Si |
| --- | --- | --- | --- | --- |
| Example 2 | 34 | 23 | 3 | 39 |
| Example 3 | 40 | 24 | 8 | 27 |
| Com. Example 2 | 39 | 22 | 1.5 | 37 |

Figure 9:
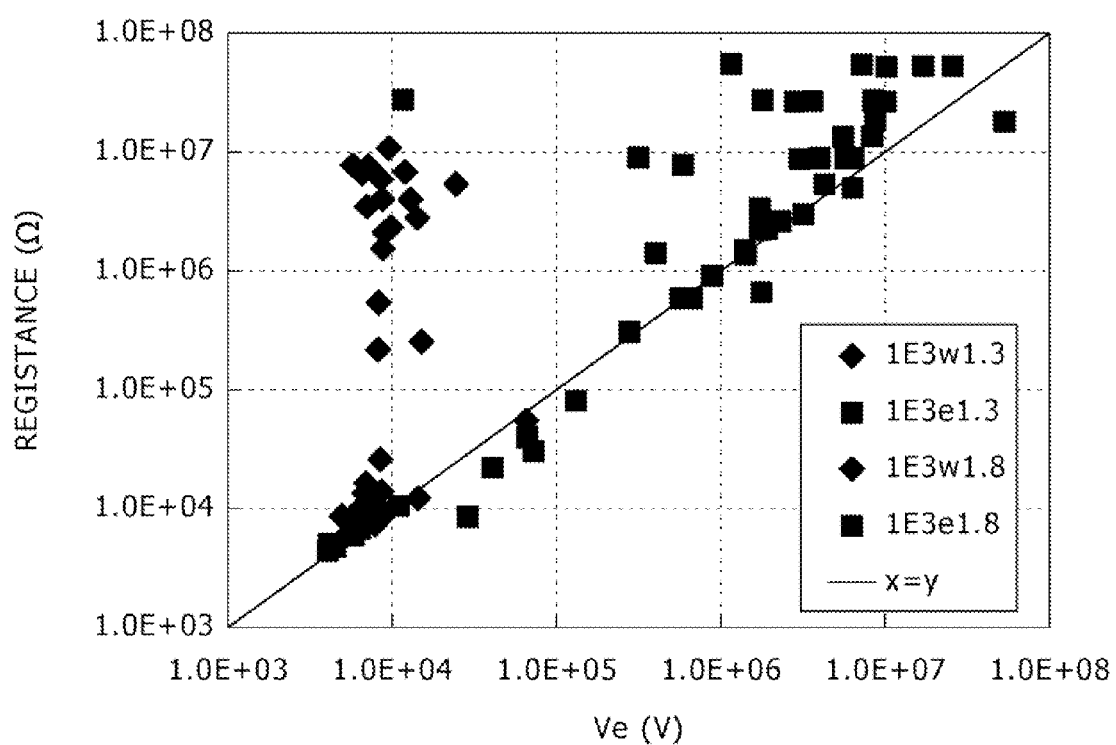
FIG. 9 is a scatter diagram plotting the change in resistance value before and after an accelerated retention test in example 2.
Figure 10:
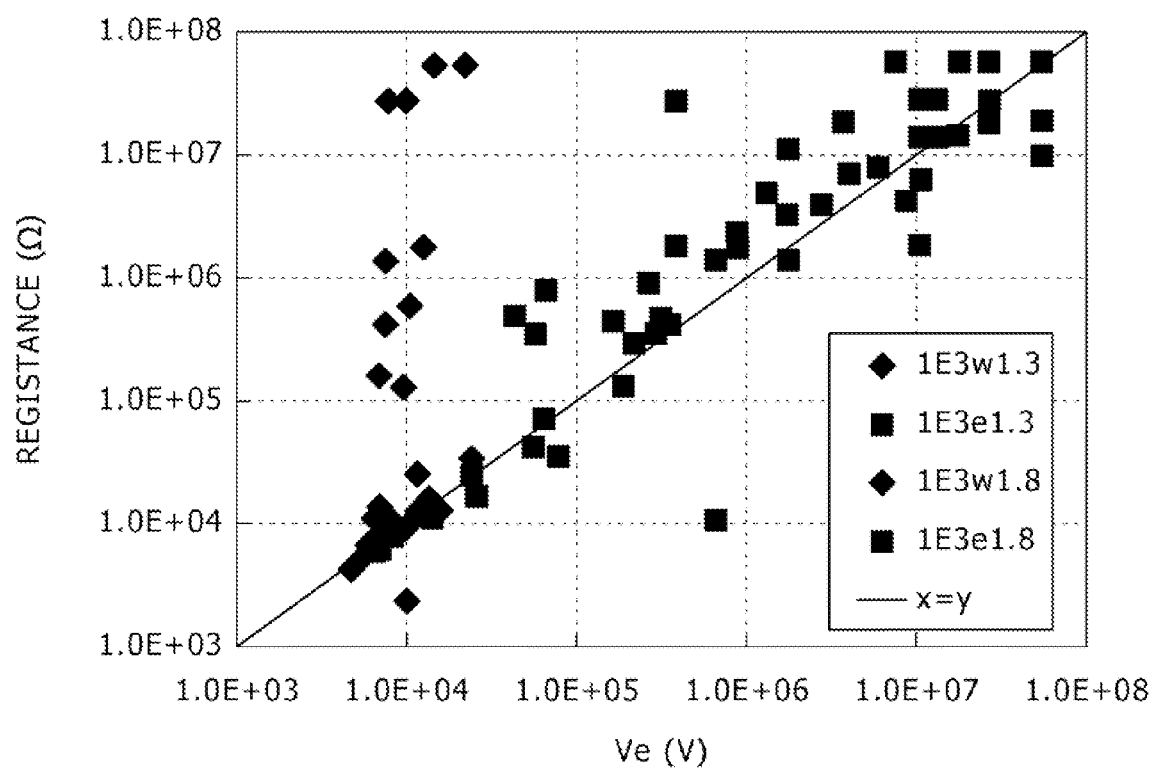
FIG. 10 is a scatter diagram plotting the change in resistance value before and after an accelerated retention test in example 3.
Figure 11:
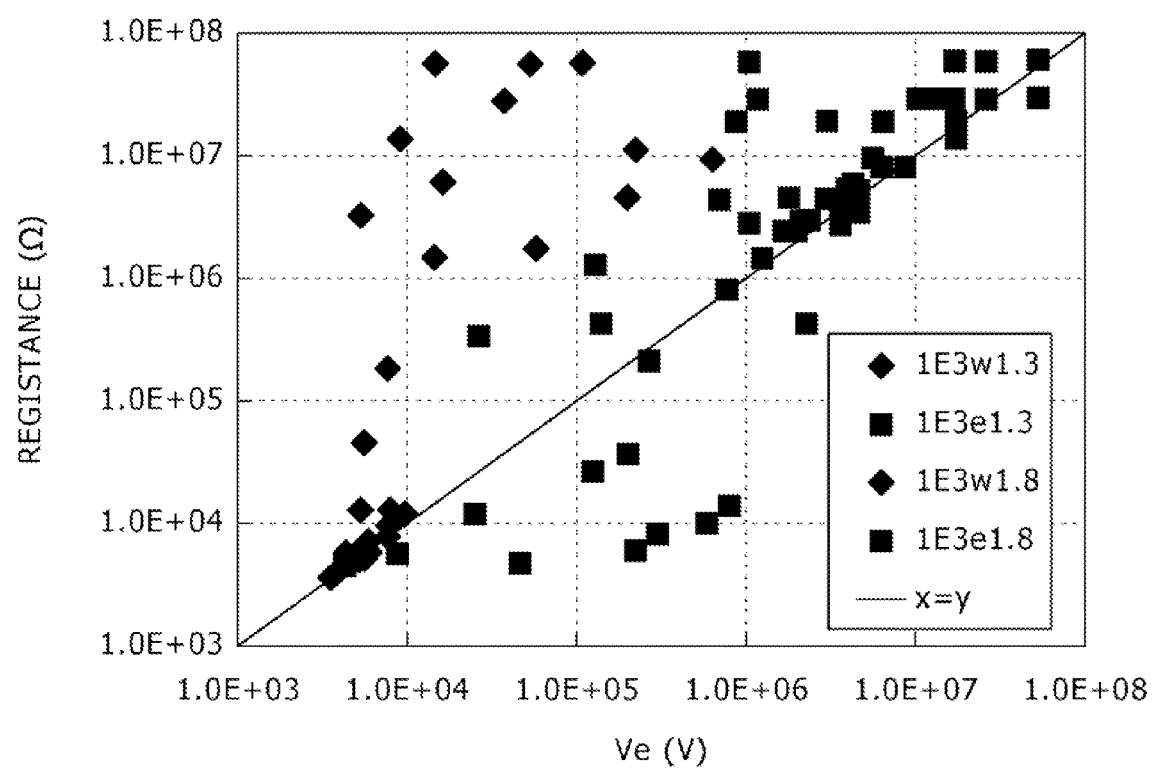
FIG. 11 is a scatter diagram plotting the change in resistance value before and after an accelerated retention test in comparative example 2.

The scatter diagrams of these repeated retention tests are illustrated in FIGS. 9 (example 2), 10 (example 3) and 11 (comparative example 2) for comparison. The test results of comparative example 2 with 1.5 atom % of Zr added are roughly the same as those of comparative example 1 with no Zr contained. The sample of comparative example 2 is hard to retain a resistance value properly unless the value is 1 MΩ or higher (high-resistance state) or 10 kΩ or lower (low-resistance state). In contrast, when 3 atom % of Zr or more is added as in example 2, a resistance value between the two states can be gradually held. Further, when the amount of Zr added is increased to 8 atom % as in example 3, the effect of addition becomes more apparent. That is, it is clear that the amount of Zr added to the ion source layer 3 should preferably be 3 atom % or more.

Figure 12:
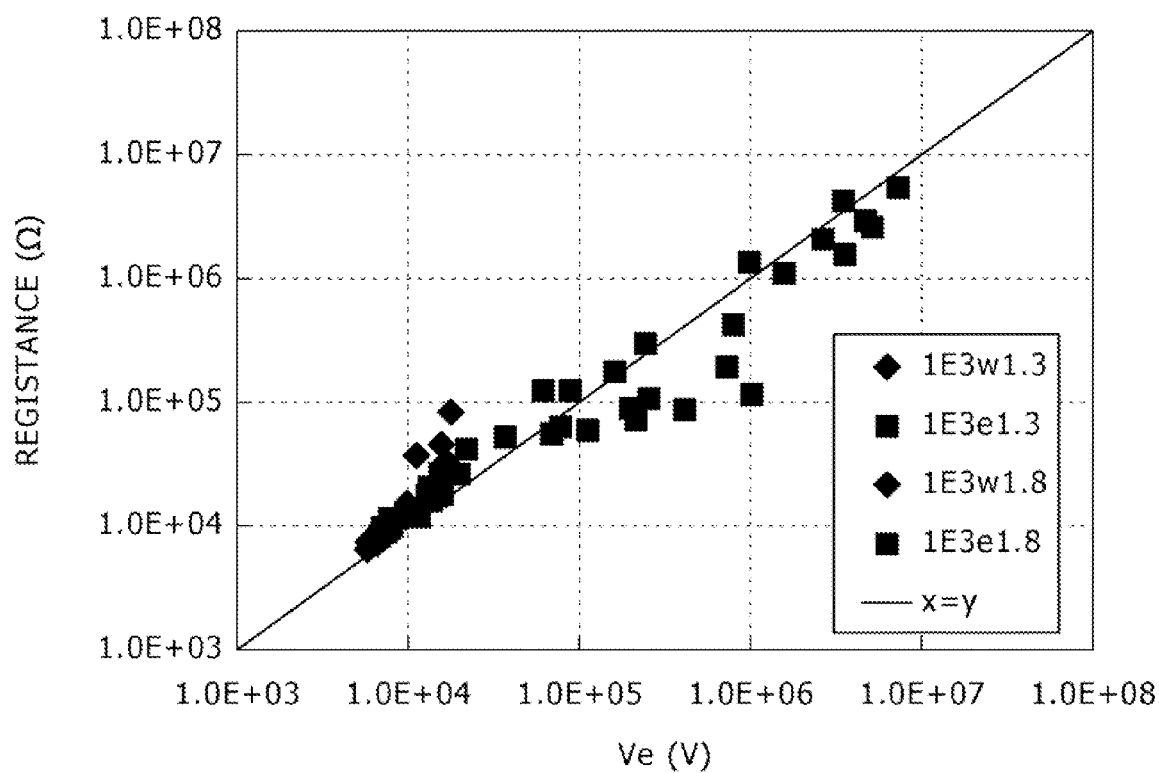
FIG. 12 is a scatter diagram plotting the change in resistance value before and after an accelerated retention test in example 4.

Up to this point, the test results of the samples with the ion source layer 3 containing Cu, Te, Zr and Si have been shown. Next, FIG. 12 illustrates the results of the 1000 repeated retention test of example 5 in which the ion source layer 3 included a Cu—Te—Zr-based alloy and did not contain Si. FIG. 12 shows that even the sample of example 5 having a simple composition of Cu, Te and Zr with no Si provides similar improvement in data retention characteristic. On the other hand, it is shown from the results of the repeated retention test of comparative example 1 (FIG. 8) in which the ion source layer was composed of Cu, Te and Si with no Zr that the sample failed to retain resistance values from 10 kΩ to 1 MΩ. It is clear therefrom that Zr provides improved resistance value retention capability.

Thus, it has become evident that Zr provides improved resistance value retention capability in any range thereof if contained in the ion source layer 3. That is, so long as the ion source layer 3 contains 3 atom % or more of Zr, the same layer 3 may include Si or other elements in addition to a combination of Cu—Te or {Cu, Ag, Zn} with {S, Se, Te}. Ge and Si are among additive elements which are highly effective in strengthening the microstructure of the ion source layer matrix or preventing the film from peeling off.

Figure 13:
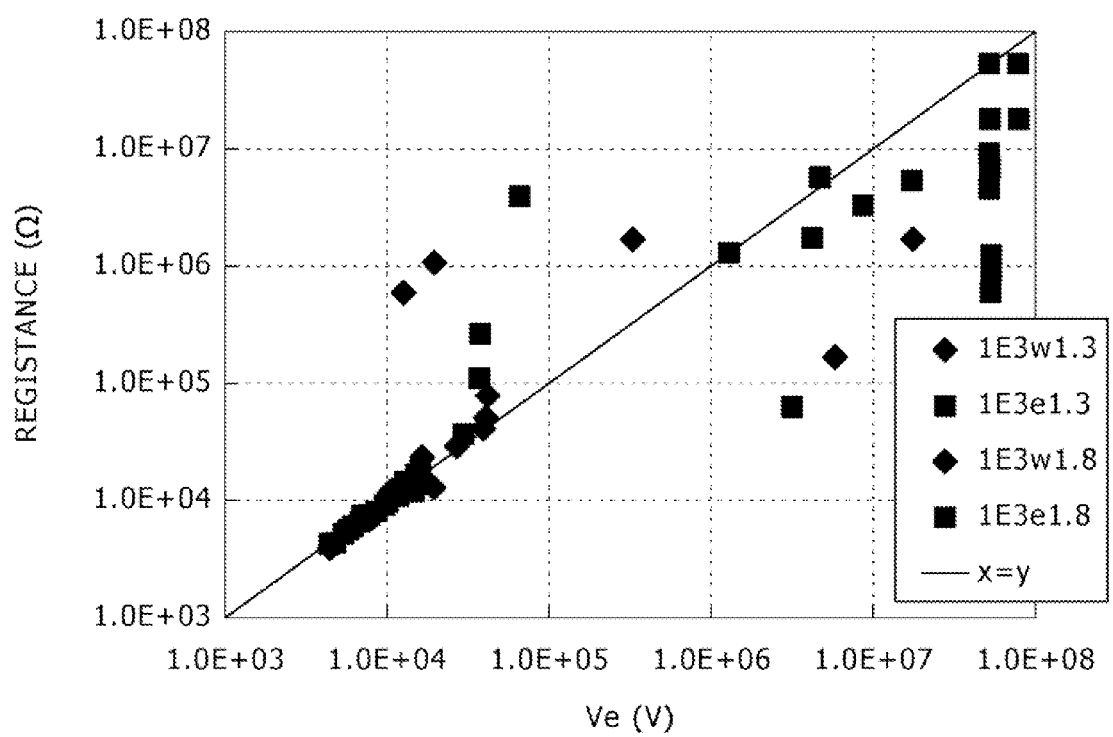
FIG. 13 is a scatter diagram plotting the change in resistance value before and after an accelerated retention test in example 6.

Next, using the test results of examples 1 and 6, the impact of the difference in memory element size on the improvement in resistance value retention capability was examined. The memory element of the sample of example 1 was circular and 30 nm in diameter, whereas that of example 6 was circular and 20 nm in diameter. As already illustrated in FIG. 7, the results of the repeated retention test of example 1 show that the sample offers excellent resistance retention capability over the entire range of resistance values. FIG. 13 illustrates the repeated retention test results of the memory element of example 6 sized 20 nm in diameter. As is clear from FIG. 13, even the miniscule memory element of 20 nm in diameter offers similarly excellent resistance retention characteristic. As a result, no particular adverse impact of reduced size of the memory element on the resistance retention capability is observed.

Figure 14:
FIG. 14 is a diagram illustrating the repetitive operating characteristic of the memory element in example 7.

Next, a description will be made of the test results when the high-resistance layer 2 does not exist between the lower electrode 1 and ion source layer 3 with reference to the test results of example 7. FIG. 14 illustrates the repeated test results of example 7. Because of absence of the high-resistance layer 2, the initial resistance is low. The resistance value in an erased state tends to increase after each repetition. Nevertheless, the sample is capable of cyclic writing and erasing operations.

Figure 15:
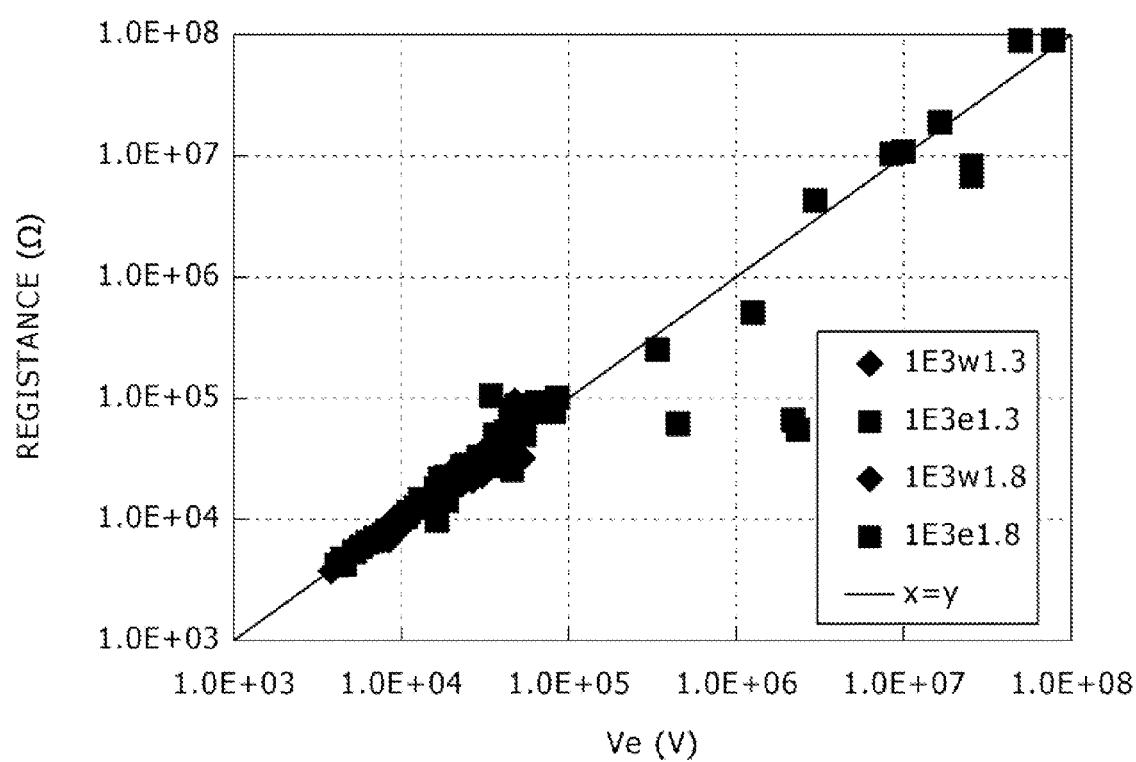
FIG. 15 is a scatter diagram plotting the change in resistance value before and after an accelerated retention test in example 7.
Figure 16A:
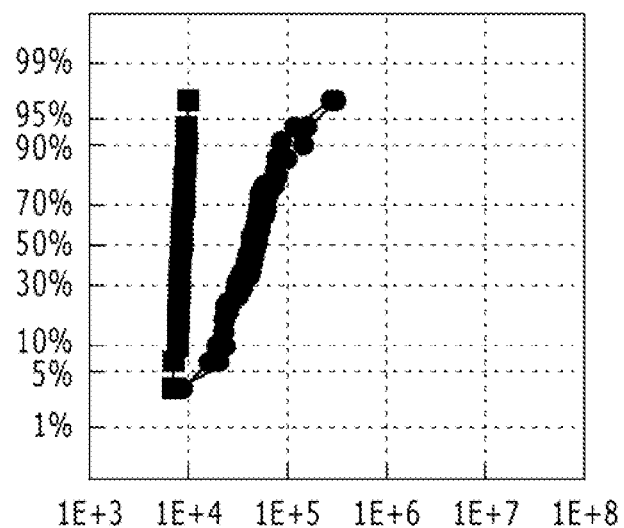
FIGS. 16A to 16C are characteristic diagrams illustrating the erasing voltage dependence of the resistance value retention characteristic in example 1.
Figure 16B:
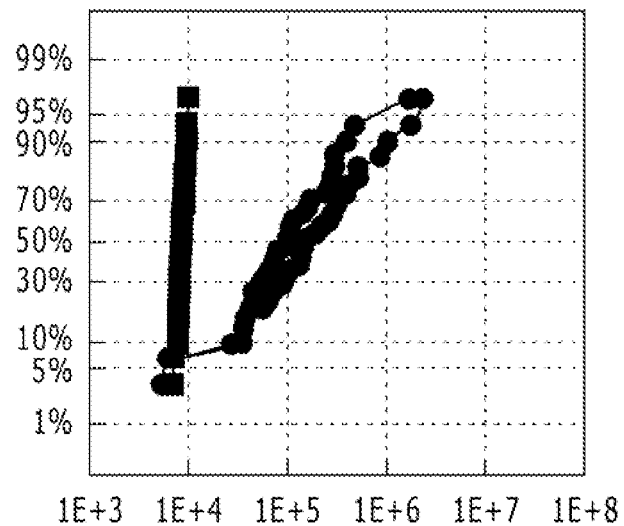
Figure 16C:
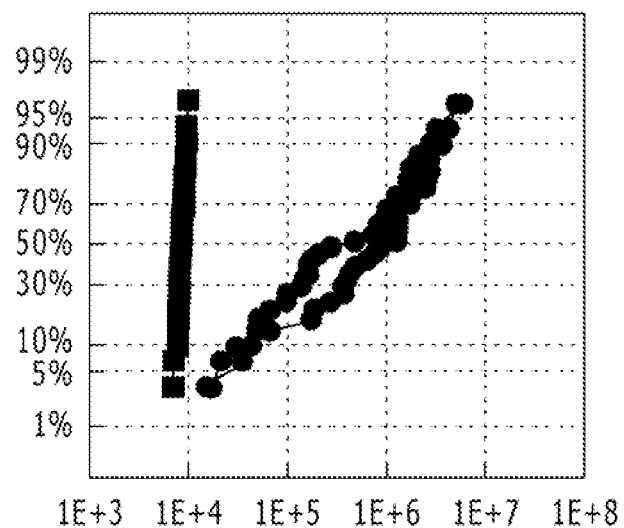
Figure 17A:
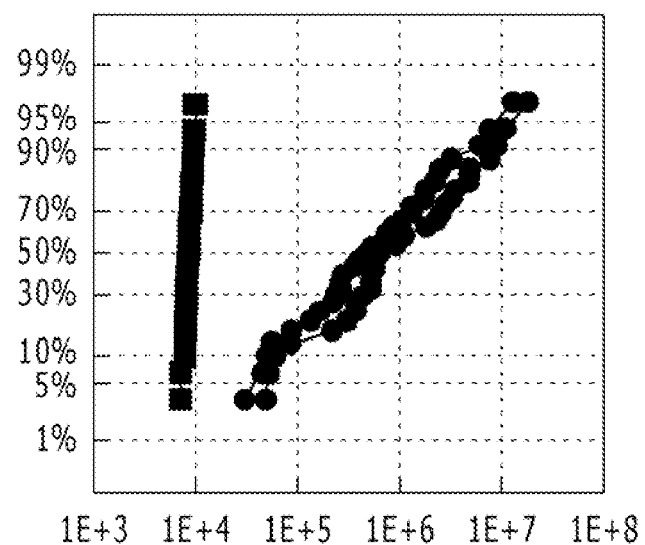
FIGS. 17A and 17B are also characteristic diagrams illustrating the erasing voltage dependence.
Figure 17B:
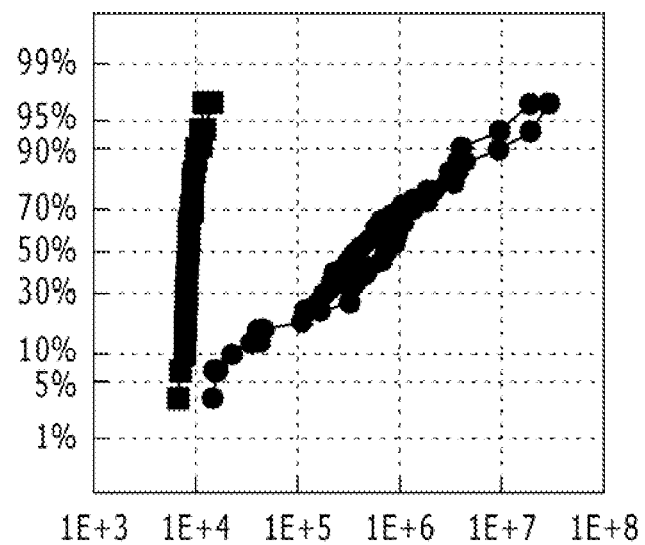

FIG. 15 illustrates the retention test results of the sample of example 7. It is clear therefrom that the sample offers excellent resistance value retention capability over the entire range of resistance values.

Therefore, it is evident that even if the storage layer 5 includes only the ion source layer 3, the memory element offers the same effect as when the same layer 5 includes not only the ion source layer 3 but also the high-resistance layer 2.

Next, the multivalued information recording characteristic of the sample of example 1 was evaluated. First, with the writing gate voltage Vgw set to 1.3 V, writing voltage to 2.5 V, erasing gate voltage to 2.5 V, and erasing voltage to 1.1 V, 1.3 V, 1.5 V, 1.7 V and 1.9 V, 60 bits were written and erased repeatedly 1000 times under the same conditions. Next, of the 60 bits that were repeatedly written and erased under the same conditions, the 30 bits were left in a written state, and the remaining 30 bits were left in an erased state to fix the data. After the resistance value was read in this condition, an accelerated retention test was performed for two hours at 120° C. The resistance value was read again after the test. FIGS. 16A to 16C and 17A and 17B illustrate the erasing voltage dependence of the resistance value retention characteristic measured as described above.

Figure 18:
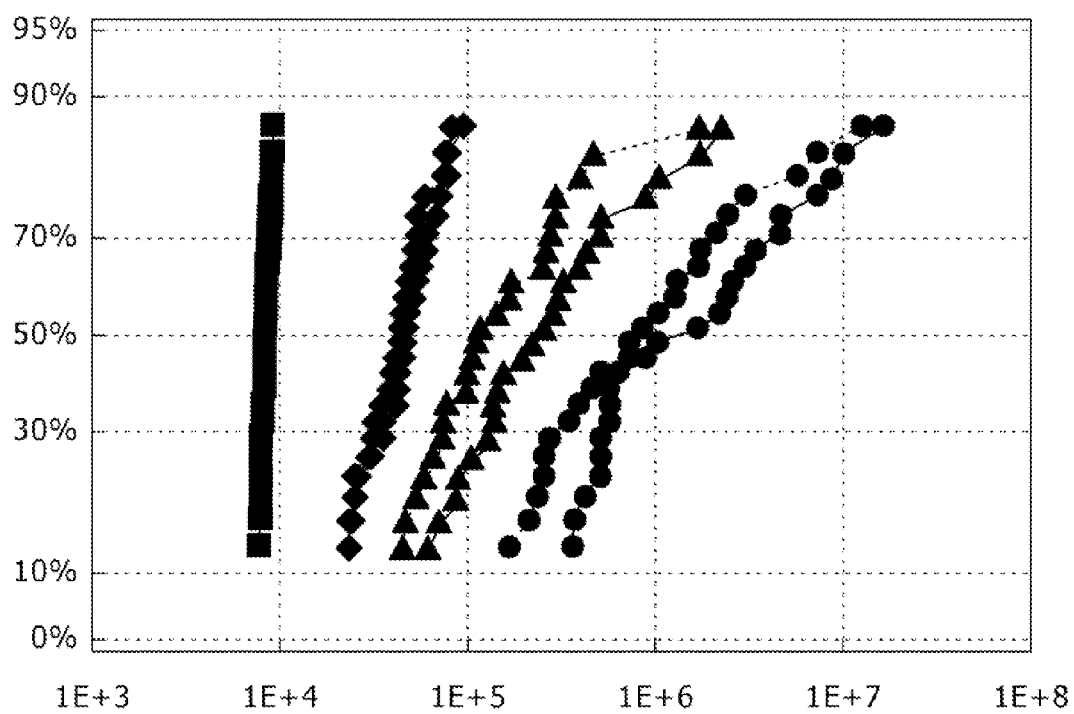
FIG. 18 is a graph plotting three conditions, namely, Ve 1.1 V, Ve 1.3 V and Ve 1.7 V in a written state, selected from FIGS. 16A to 16C and 17A and 17B.

As illustrated in FIGS. 16A to 16C and FIGS. 17A and 17B, it is clear that the larger the erasing voltage, the higher the resistance value in an erased state, and that the resistance value was successfully held even after the accelerated retention test. Here, of the 30 bits under measurement, six bits were treated as defective for the sake of convenience. The written state and Ve 1.1 V, Ve 1.3 V and Ve 1.7 V were selected from the conditions of FIGS. 16A to 16C and FIGS. 17A and 17B. FIG. 18 illustrates the results plotted in a graph.

It is clear from FIG. 18 that the four values are successfully separated from each other. This corresponds to recording of multivalued information of two bits per element because $2^2=4$. The resistance levels can be made uniform with each other if error correction is performed additionally. It is easily presumable that quaternary or more information can also be recorded by the same method.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A memory element having a storage layer containing an ion source layer between a first electrode and a second electrode, the memory element storing information by changing an electrical characteristic of the storage layer, wherein
at least Zr is added to the ion source layer as a metal element together with an ion conducting material.

2. The memory element of claim 1, wherein the amount of Zr contained in the ion source layer is 3 atom % or more to 40 atom % or less.

3. The memory element of claim 1, wherein the ion source layer further contains Cu.

4. The memory element of claim 3, wherein the ion source layer further contains Si.

5. The memory element of claim 4, wherein the amount of Si contained in the ion source layer is from 10 atom % or more to 45 atom % or less.

6. The memory element of claim 1, wherein the ion conducting material of the storage layer is at least one of S, Se and Te.

7. The memory element of claim 1, wherein
a first state is stored in the memory element by applying a first voltage or a current pulse between the first electrode and the second electrode to form a conduction path containing at least the Zr in the storage layer, and
a second state is stored in the memory element by applying a second voltage or a current pulse opposite in polarity to the first voltage or the current pulse between the first electrode and the second electrode to eliminate the conduction path formed in the storage layer.

8. The memory element of claim 1, wherein the high-resistance layer is an oxide or a nitride.

9. A memory device comprising: a plurality of memory elements, each having a storage layer containing an ion source layer between a first electrode and a second electrode, the memory element storing information by changing an electrical characteristic of the storage layer; and pulse application means for selectively applying a voltage or current pulse to the plurality of memory elements, wherein at least Zr is added to the ion source layer as a metal element together with an ion conducting material, wherein the amount of Zr contained in the ion source layer 3 atom % or more, wherein the storage layer has a high-resistance layer higher in resistance value than the ion source layer between the ion layer and the first electrode.

10. The memory device of claim 9 wherein the amount of Zr contained in the ion source layer is from 3 atom % or more to 40 atom % or less.

11. The memory device of claim 9, wherein the ion source layer further contains Cu.

12. The memory device of claim 11, wherein the ion source layer further contains Si.

13. The memory device of claim 12, wherein the amount of Si contained in the ion source layer is from 10 atom % or more to 45 atom % or less.

14. The memory device of claim 9, wherein each of the memory elements stores binary or more multilevel states.

15. The memory device of claim 9, wherein some of the layers making up each of the memory elements are commonly formed with the same layers in the plurality of memory elements adjacent to each other.

16. The memory device of claim 15, wherein the common layers in the plurality of memory elements are a high-resistance layer, ion source layer and second electrode, and the first electrode is formed separately for each of the memory elements.

17. The memory device of claim 9, wherein
a first state is stored in the memory element by applying a first voltage or a current pulse between the first electrode and the second electrode to form a conduction path containing at least the Zr in the storage layer, and
a second state is stored in the memory element by applying a second voltage or a current pulse opposite in polarity to the first voltage or the current pulse between the first electrode and the second electrode to eliminate the conduction path formed in the storage layer.

18. The memory device of claim 9, wherein the high-resistance layer is an oxide or a nitride.

* * * * *